(12) United States Patent
Kim et al.

(10) Patent No.: US 9,190,402 B2
(45) Date of Patent: Nov. 17, 2015

(54) SEMICONDUCTOR DEVICE COMPRISING CAPACITOR AND METHOD OF MANUFACTURING THE SAME

(71) Applicant: Samsung Electronics Co., Ltd., Suwon-Si, Gyeonggi-Do (KR)

(72) Inventors: Yoon-Hae Kim, Suwon-si (KR); Hwa-Sung Rhee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 43 days.

(21) Appl. No.: 14/245,079

(22) Filed: Apr. 4, 2014

(65) Prior Publication Data

US 2015/0061073 A1    Mar. 5, 2015

(30) Foreign Application Priority Data

Aug. 30, 2013   (KR) .................. 10-2013-0104092

(51) Int. Cl.
| | | |
|---|---|---|
| *H01L 21/02* | (2006.01) | |
| *H01L 27/01* | (2006.01) | |
| *H01L 23/522* | (2006.01) | |
| *H01L 49/02* | (2006.01) | |
| *H01L 21/768* | (2006.01) | |
| *H01L 27/108* | (2006.01) | |

(52) U.S. Cl.
CPC .......... *H01L 27/016* (2013.01); *H01L 23/5223* (2013.01); *H01L 23/5228* (2013.01); *H01L 28/20* (2013.01); *H01L 28/60* (2013.01); *H01L 21/76879* (2013.01); *H01L 27/10852* (2013.01); *H01L 27/10858* (2013.01); *H01L 27/10861* (2013.01)

(58) Field of Classification Search
CPC .................. H01L 21/76879; H01L 27/10852; H01L 27/10858; H01L 27/10891
USPC .................................................. 257/532, 758
See application file for complete search history.

(56) References Cited

U.S. PATENT DOCUMENTS

| | | | |
|---|---|---|---|
| 6,890,810 B2 | 5/2005 | Amadon et al. | |
| 7,189,615 B2 | 3/2007 | Rao et al. | |
| 7,808,077 B2 * | 10/2010 | Egashira et al. | ............... 257/532 |
| 8,017,490 B2 | 9/2011 | Kim et al. | |
| 8,212,333 B2 | 7/2012 | Yun | |
| 8,836,126 B2 * | 9/2014 | Ochimizu et al. | ............ 257/758 |
| 2003/0219956 A1 * | 11/2003 | Mori et al. | ..................... 438/393 |

(Continued)

FOREIGN PATENT DOCUMENTS

| | | |
|---|---|---|
| KR | 10-1044612 B1 | 6/2011 |
| KR | 10-1138166 B1 | 4/2012 |
| KR | 10-1146225 B1 | 5/2012 |

*Primary Examiner* — Nicholas Tobergte
(74) *Attorney, Agent, or Firm* — Harness, Dickey & Pierce, P.L.C.

(57) ABSTRACT

A semiconductor device includes an interlayer dielectric layer on a substrate, the interlayer dielectric layer having an upper surface, a lower plug extending down into the interlayer dielectric layer from the upper surface of the interlayer dielectric layer, the lower plug having an upper surface, a first dielectric layer pattern on the upper surface of the lower plug, at least a portion of the first dielectric layer pattern being directly connected to the upper surface of the lower plug, a first metal electrode pattern on the first dielectric layer pattern, a first upper plug electrically connected to the first metal electrode pattern, and a second upper plug on the lower plug, the second upper plug being spaced apart from the first upper plug.

18 Claims, 8 Drawing Sheets

(56) References Cited

U.S. PATENT DOCUMENTS

2007/0099414 A1* 5/2007 Frohberg et al. .............. 438/618
2008/0290385 A1* 11/2008 Urushido ...................... 257/295
2008/0316807 A1 12/2008 Hyun et al.
2013/0161722 A1 6/2013 Son et al.

* cited by examiner

SEMICONDUCTOR DEVICE COMPRISING CAPACITOR AND METHOD OF MANUFACTURING THE SAME

CROSS-REFERENCE TO RELATED APPLICATIONS

This U.S. non-provisional patent application claims priority under 35 U.S.C. §119 to Korean Patent Application No. 10-2013-0104092, filed on Aug. 30, 2013, in the Korean Intellectual Property Office (KIPO), the contents of which are herein incorporated by reference in their entirety.

BACKGROUND

1. Field

Some example embodiments of the present inventive concepts relate to a semiconductor device having a capacitor and/or a method of manufacturing the same. Other example embodiments of the present inventive concepts relate to a semiconductor device including a metal-insulator-metal (MIM) capacitor and a thin film resistor (TFR) in order to be applied to system-on-chip (SOC) applications, wired and wireless devices, and high-frequency circuit devices and/or a method of manufacturing the same.

2. Description of the Related Art

Analog capacitors have been applied to complimentary metal-oxide-semiconductor integrated circuits (CMOS IC), specifically, analog-to-digital convertors or switching-capacitor filters. In this case, the analog capacitors may have various structures for an upper electrode and a lower electrode, e.g., a polysilicon-insulator-polysilicon (PIP) structure, a polysilicon-insulator-metal (PIM) structure, a metal-insulator-polysilicon (MIP) structure, or a metal-insulator-metal (MIM) structure. The metal-insulator-metal (MIM) structure among them has mainly been applied to the analog capacitors because the amount of capacitance change which may be induced by the voltage difference between the upper electrode and the lower electrode is less than the others.

Meanwhile, a thin film resistor which is a typical passive component also has been used in semiconductor devices because the thin film transistor generally has a very high linearity.

SUMMARY

Some example embodiments of the present inventive concepts provide a semiconductor device having a capacitor and a method of manufacturing the same.

According to an example embodiment of the inventive concepts, a semiconductor device includes an interlayer dielectric layer on a substrate, the interlayer dielectric layer having an upper surface, a lower plug extending down into the interlayer dielectric layer from the upper surface of the interlayer dielectric layer, the lower plug having an upper surface, a first dielectric layer pattern on the upper surface of the lower plug, at least a portion of the first dielectric layer pattern being directly connected to the upper surface of the lower plug, a first metal electrode pattern on the first dielectric layer pattern, a first upper plug electrically connected to the first metal electrode pattern, and a second upper plug on the lower plug, the second upper plug being spaced apart from the first upper plug.

The semiconductor device may further include a device isolation region in the substrate, wherein the lower plug may pass through the interlayer dielectric layer and into the device isolation region. The first dielectric layer pattern may include a high-k dielectric layer.

The lower plug may include a capacitor lower electrode and the first metal electrode pattern may include a capacitor upper electrode. The lower plug and the first metal electrode pattern may include at least one metal element. The lower plug may include tungsten (W), and the first metal electrode pattern may include at least one of titanium (Ti), titanium nitride (TiN), tantalum (Ta), tantalum nitride (TaN), tungsten silicide (WSi$_x$), tantalum silicon nitride (TaSiN), and tungsten nitride (WN). The lower plug may include a barrier metal layer.

The semiconductor device may further include a second dielectric layer pattern on the interlayer dielectric layer, the second dielectric layer pattern being spaced apart from the first dielectric layer pattern, a second metal electrode pattern on the second dielectric layer pattern, a third upper plug on the second metal electrode pattern, and a fourth upper plug on the second metal electrode pattern, the fourth upper plug being spaced apart from the third upper plug.

The upper surfaces of the first upper plug, the second upper plug, the third upper plug and the fourth upper plug may be at a same level. The second metal electrode pattern may include a thin film resistor. The first dielectric layer pattern may be at the same level as the second dielectric layer pattern, and the first metal electrode pattern may be at the same level as the second metal electrode pattern.

According to another example embodiment of the inventive concepts, a semiconductor device includes an interlayer dielectric layer on a substrate, a capacitor lower electrode in the interlayer dielectric layer, the capacitor lower electrode having a plug shape and a planarized upper surface, a first dielectric layer pattern on the planarized upper surface of the capacitor lower electrode, a capacitor upper electrode on the first dielectric layer pattern, a second dielectric layer pattern on the interlayer dielectric layer, the second dielectric layer pattern spaced apart from the first dielectric layer pattern and including a same material and having a same thickness as the first dielectric layer pattern, and a thin film resistor on the second dielectric layer pattern, the thin film resistor including a same material and having a same thickness as the capacitor upper electrode.

The semiconductor device may further include a device isolation region in the substrate, wherein the capacitor lower electrode may pass through the interlayer dielectric layer to connect with the device isolation region. The semiconductor device may further include an etch stop layer conformally formed on the interlayer dielectric layer, the upper surface of the capacitor upper electrode, and the upper surface of the thin film resistor.

According to another example embodiment of the inventive concepts, a method of manufacturing a semiconductor device includes providing a substrate having a device isolation region, forming an interlayer dielectric layer on the substrate and the device isolation region, forming a lower plug passing through the interlayer dielectric layer, forming a first dielectric layer pattern directly on the lower plug, forming a first metal electrode pattern on the first dielectric layer pattern, forming a first upper plug electrically connected to the first metal electrode pattern, and forming a second upper plug on the lower plug, the second upper plug being spaced apart from the first upper plug.

The lower plug may be connected to the device isolation region. The method may further include forming a second dielectric layer pattern on the interlayer dielectric layer, the second dielectric layer pattern being spaced apart from the first dielectric layer pattern, forming a second metal electrode pattern on the second dielectric layer pattern, the second metal electrode pattern including a thin film resistor, forming a third upper plug on the second metal electrode pattern, and forming a fourth upper plug on the second metal electrode pattern, the fourth upper plug being spaced apart from the third upper plug. The first upper plug, the second upper plug, the third upper plug and the fourth upper plug may be formed simultaneously and to have upper surfaces at a same level.

According to another example embodiment of the inventive concepts, a semiconductor device includes an interlayer dielectric layer, first and second dielectric layer patterns spaced apart from each other on the interlayer dielectric layer, a lower plug disposed in the interlayer dielectric layer and directly connected to a bottom surface of the first dielectric layer pattern, first and second upper plugs spaced apart from each other on the lower plug, first and second metal electrode patterns on the first and second dielectric layer patterns, respectively, the first metal electrode pattern connected to a bottom surface of the first upper plug, and third and fourth upper plugs spaced apart from each other on the second metal electrode pattern.

The upper surfaces of the first upper plug, the second upper plug, the third upper plug and the fourth upper plug may be at a same level. The first dielectric layer pattern may be at the same level as the second dielectric layer pattern, and the first metal electrode pattern may be at the same level as the second metal electrode pattern. The lower plug may include a capacitor lower electrode, the first metal electrode pattern may include a capacitor upper electrode, and the second metal electrode pattern may include a thin film resistor.

BRIEF DESCRIPTION OF THE DRAWINGS

The foregoing and other features and advantages of the inventive concepts will be apparent from the more particular description of the example embodiments, as illustrated in the accompanying drawings in which like reference characters refer to the same parts throughout the different views. The drawings are not necessarily to scale, emphasis instead being placed upon illustrating the principles of the inventive concepts.

DETAILED DESCRIPTION

Figure 1:
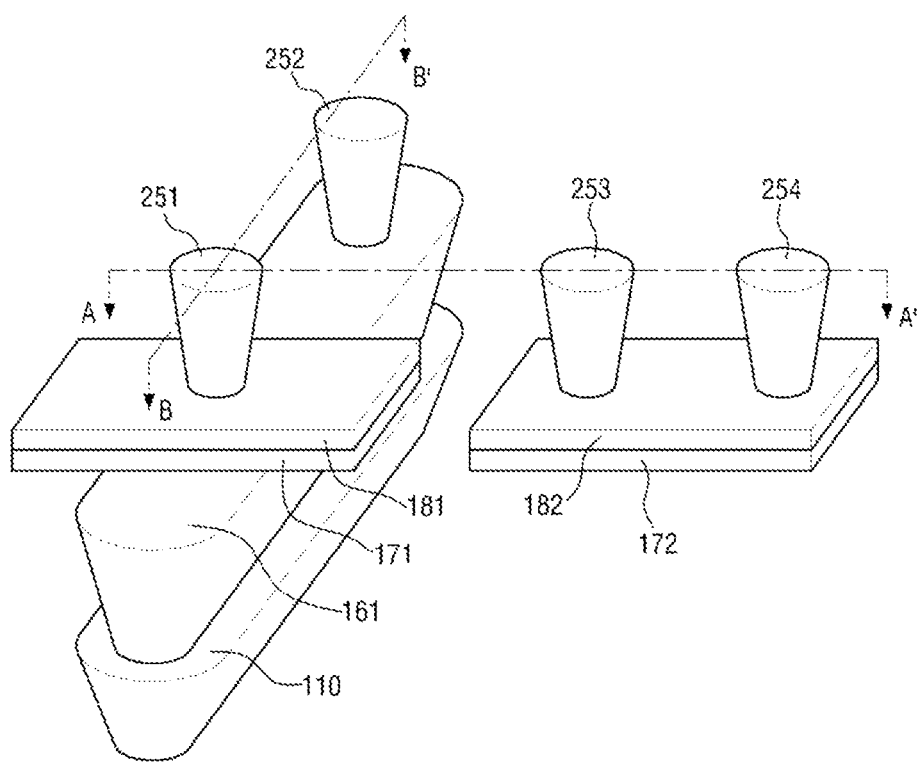
FIG. 1 is a perspective view illustrating a semiconductor device according to an example embodiment of the inventive concepts.

Example embodiments of the inventive concepts will now be described more fully hereinafter with reference to the accompanying drawings; however, they may be embodied in different forms and should not be construed as limited to the example embodiments set forth herein. Rather, these example embodiments are provided so that this disclosure will be thorough and complete, and will fully convey the scope of the inventive concepts to those skilled in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent").

It will be understood that, although the terms "first", "second", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

In the drawing figures, the dimensions of layers and regions may be exaggerated for clarity of illustration. Like reference numerals refer to like elements throughout. The same reference numbers indicate the same components throughout the specification.

Spatially relative terms, e.g., "beneath," "below," "lower," "above," "upper" and the like, may be used herein for ease of description to describe the relationship of one element or feature to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to") unless otherwise noted.

Unless defined otherwise, all technical and scientific terms used herein have the same meaning as commonly understood by one of ordinary skill in the art. It is noted that the use of any and all examples, or exemplary terms provided herein is intended merely to better illuminate the example embodiments and is not a limitation on the scope of the inventive concepts unless otherwise specified.

Example embodiments will be described with reference to perspective views, cross-sectional views, and/or plan views. The profile of an example view may be modified according to, e.g., manufacturing techniques and/or allowances. Accordingly, the example embodiments are not intended to limit the scope, but cover all changes and modifications that can be caused due to, e.g., a change in manufacturing process. Thus, regions shown in the drawings are illustrated in schematic form and the shapes of the region are presented simply by way of illustration and not as a limitation.

Hereinafter, example embodiments of the inventive concepts will be described in detail with reference to the accompanying drawings.

FIG. 1 is a perspective view illustrating a semiconductor device according to an example embodiment of the inventive concepts.

Figure 2A:
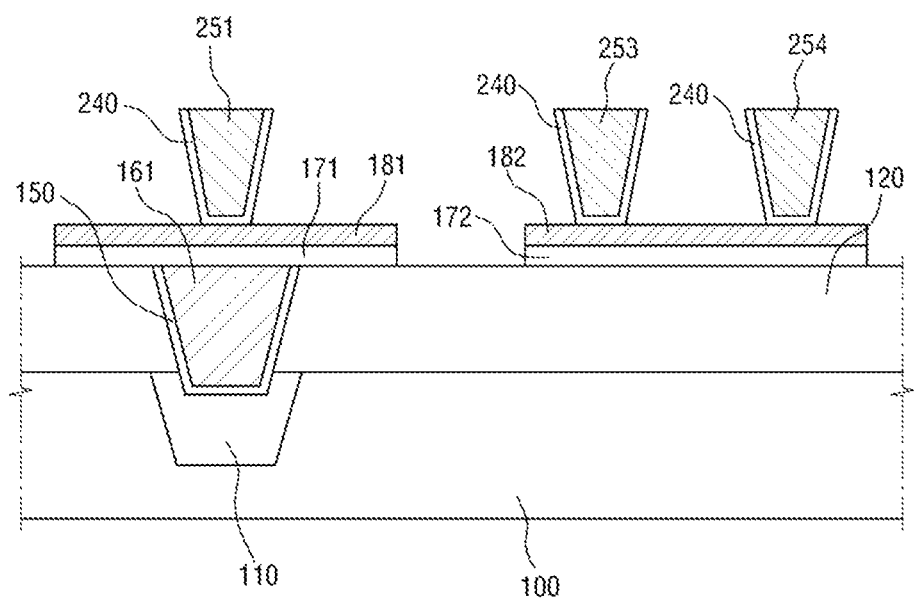
FIG. 2A is a cross-sectional view according to line A-A' of FIG. 1.
Figure 2B:
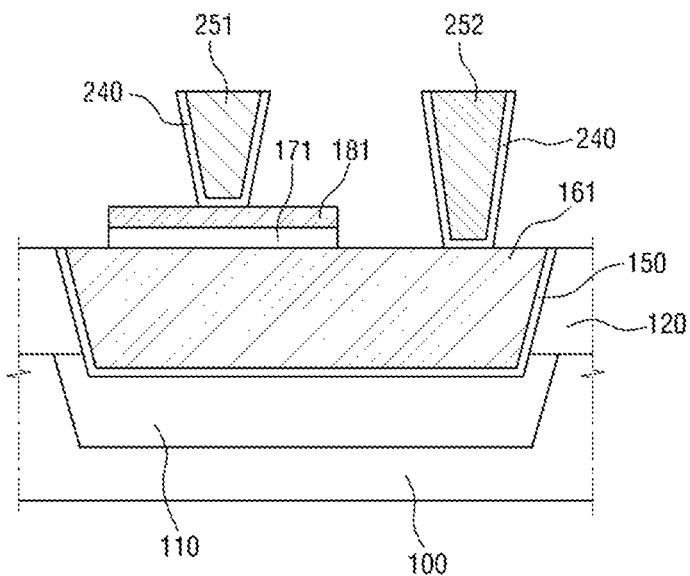
FIG. 2B is a cross-sectional view according to line B-B' of FIG. 1.

Referring to FIG. 1, a device isolation region 110 may be disposed in a substrate 100 shown in FIGS. 2A and 2B. The substrate 100 is not described in FIG. 1 in order to better understand the shape of the device isolation region 110. A lower plug or capacitor lower electrode 161 may be disposed on the device isolation region 110. The lower plug or capacitor lower electrode 161 may be physically connected to an upper surface of the device isolation region 110 and include a first barrier metal layer 150 at the lower portion of the lower plug or capacitor lower electrode 161 as shown in FIGS. 2A and 2B. The lower plug or capacitor lower electrode 161 may include tungsten (W) and be used as a bottom electrode of a capacitor. A first dielectric layer pattern 171 may be disposed on an upper surface of the lower plug or capacitor lower electrode 161. A portion of the first dielectric layer pattern 171 may be directly connected to the upper surface of the lower plug or capacitor lower electrode 161 and include a high-k dielectric material. The first dielectric layer pattern 171 may be used as a capacitor dielectric layer. The first metal electrode pattern or capacitor upper electrode 181 may be disposed on the first dielectric layer pattern 171. The first metal electrode pattern or capacitor upper electrode 181 may include at least one of titanium (Ti), titanium nitride (TiN), tantalum (Ta), tantalum nitride (TaN), tungsten silicide ($WSi_x$), tantalum silicon nitride (TaSiN), and tungsten nitride (WN). The first metal electrode pattern or capacitor upper electrode 181 and the first dielectric layer pattern 171 may have substantially the same size. Sidewalls of the first metal electrode pattern or capacitor upper electrode 181 and the first dielectric layer pattern 171 may be continuously connected to each other. On the other hand, if the first dielectric layer pattern 171 is used as an etch stop layer when the first metal electrode pattern or capacitor upper electrode 181 is formed on the first dielectric layer pattern 171, the first metal electrode pattern or capacitor upper electrode 181 and the first dielectric layer pattern 171 may have different sizes. The first metal electrode pattern 181 may be used as an upper electrode of a capacitor.

A first upper plug 251 may be disposed on the first metal electrode pattern or capacitor upper electrode 181. The first upper plug 251 may include at least one of copper (Cu) and tungsten (W). The first upper plug 251 may also include a second barrier metal 240 at a lower portion of the first upper plug 251 as shown in FIGS. 2A and 2B. A second upper plug 252 which is spaced apart from the first upper plug 251 may be disposed on the lower plug or capacitor lower electrode 161. At this moment, the second upper plug 252 should not be directly connected to the first metal electrode pattern or capacitor upper electrode 181 and may also include the second barrier metal layer 240 as shown in FIG. 2B.

A second dielectric layer pattern 172 which is spaced apart from the first dielectric layer pattern 171 may be disposed on the first interlayer dielectric layer 120 as shown in FIG. 2A. A second metal electrode pattern 182 may be disposed on the second dielectric layer pattern 172. The second metal electrode pattern 182 may include substantially the same material and have substantially the same thickness with the first metal electrode pattern or capacitor upper electrode 181 if the first and second metal electrode patterns 181 and 182 may be formed simultaneously. The second metal electrode pattern 182 may be used as a thin film resistor. A third upper plug 253 may be disposed on the second metal electrode pattern 182 and the fourth upper plug 254 which is spaced apart from the third upper plug 253 may be disposed on the second metal electrode pattern 182. The upper surfaces of the first, second, third and fourth plugs 251, 252, 253 and 254 may have substantially the same level.

The first and second dielectric layer patterns 171 and 172 may also have substantially the same thickness and substantially the same level and include same material. Similarly, the first and second metal electrode patterns 181 and 182 may have substantially the same thickness and substantially the same level.

FIG. 2A is a cross-sectional view according to line A-A' of FIG. 1 and FIG. 2B is a cross-sectional view according to line B-B' of FIG. 1.

Referring to FIGS. 2A and 2B, it is possible to better understand the position relationship of the substrate 100, the device isolation region 110, the first interlayer dielectric layer 120, the lower plug or capacitor lower electrode 161, and the first and second dielectric layer patterns 171 and 172 disposed in the semiconductor device according to an example embodiment of the inventive concepts. In addition, it is possible to better understand the position relationship of the lower plug or capacitor lower electrode 161 including the first barrier metal layer 150 and the first, second, third and fourth upper plugs 251, 252, 253 and 254 including the second barrier metal layer 240. A bottom of the lower plug or capacitor lower electrode 161 which is passing through the first interlayer dielectric layer 120 may be disposed on a recessed upper surface of the device isolation region 110. On the other hand, a portion of the first interlayer dielectric layer 120 may remain between the bottom of the lower plug or capacitor lower electrode 161 and the upper surface of the device isolation region 110.

FIGS. 3 through 13B are cross-sectional views illustrating a method of manufacturing a semiconductor device according to another example embodiment of the inventive concepts.

Figure 3:
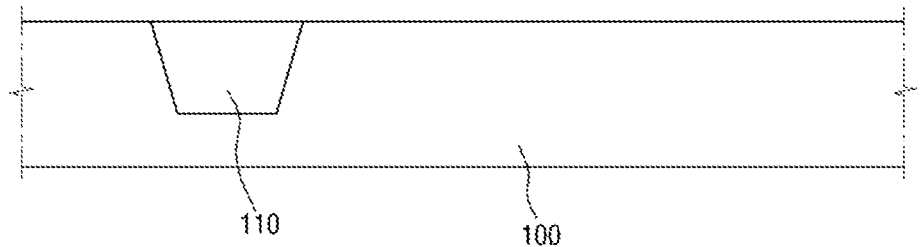
FIGS. 3 through 13B are cross-sectional views illustrating a method of manufacturing a semiconductor device according to another example embodiment of the inventive concepts.

Referring to FIG. 3, a device isolation region 110 may be formed in a substrate 100. The substrate 100 may comprise a rigid substrate, e.g., a bulk silicon substrate, a silicon-on-insulator (SOI) substrate, a germanium substrate, a silicon germanium substrate, an indium antimonide substrate, a lead telluride substrate, an indium arsenide substrate, an indium phosphorus substrate, a gallium arsenide substrate, or an antimony gallium substrate. The device isolation layer 110 may comprise a silicon oxide layer formed by a high-density plasma (HDP) process or a flowable chemical vapor deposition (FCVD) process.

Figure 4:
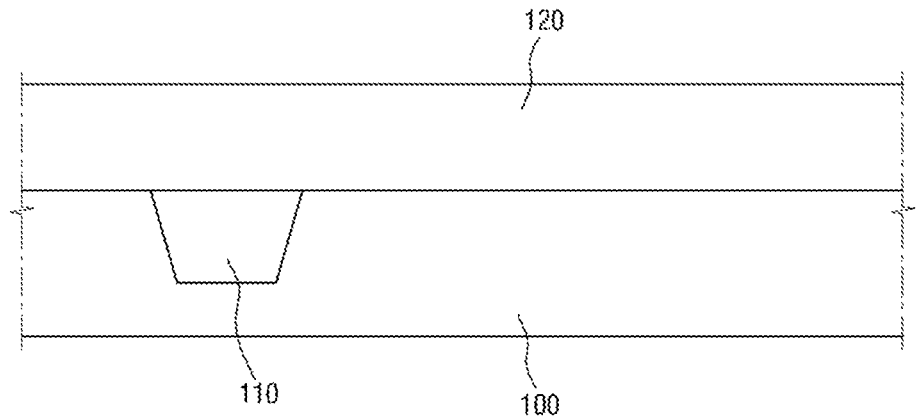

Referring to FIG. 4, a first interlayer dielectric layer 120 may be formed on the substrate 100 and the device isolation region 110. The first interlayer dielectric layer 120 may be formed by using a high-density plasma (HDP) process, a spin-on-glass (SOG) process, a chemical vapor deposition (CVD) process, or a flowable chemical vapor deposition (FCVD) process.

Figure 5:
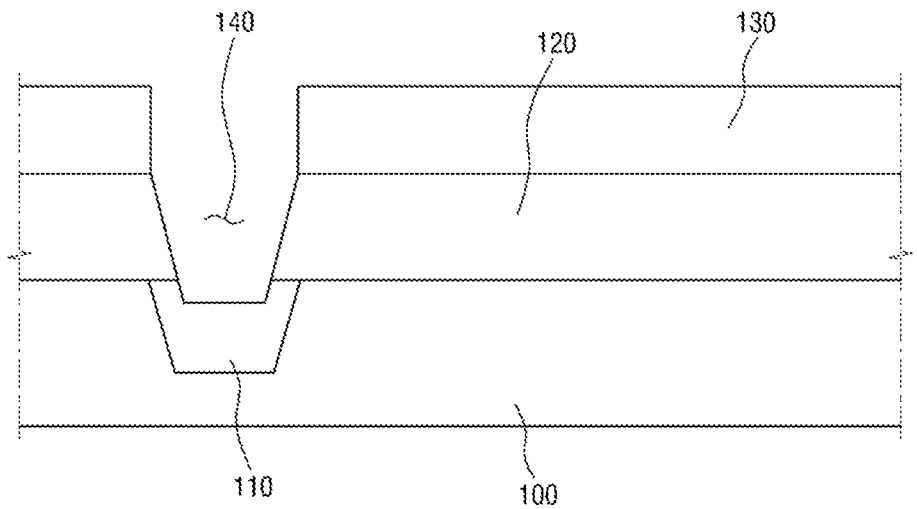

Referring to FIG. 5, a first mask pattern 130 may be formed on the first interlayer dielectric layer 120. The mask pattern 130 may include at least one of a photoresist pattern and a silicon nitride layer. A lower contact hole 140 may be formed in the first interlayer dielectric layer 120. A method of forming the lower contact hole 140 may include etching the first interlayer dielectric layer 120 which is not covered by the first mask pattern 130 using a dry etch process. At this moment, an upper surface of the device isolation region 110 may be exposed or recessed to a certain depth. On the other hand, the dry etch process may be stopped while the upper surface of the device isolation region 110 is not exposed and a portion of the first interlayer dielectric layer 120 is remained on the device isolation region 110.

Figure 6:
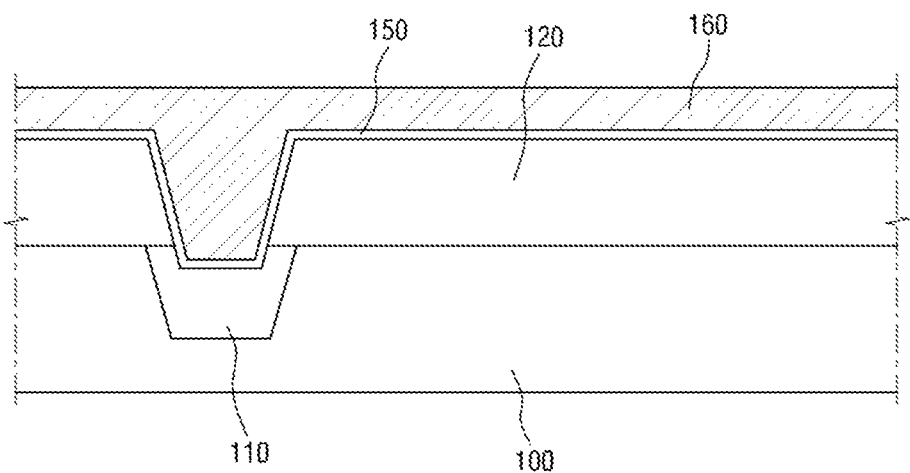

Referring to FIG. 6, a lower plug layer 160 may be formed in the lower contact hole 140. A first barrier metal layer 150 may be conformally formed on the sidewall and the bottom of the lower contact hole 140 before forming the lower plug layer 160. The lower plug layer 160 may include tungsten (W) and the first barrier metal layer 150 may include at least one of titanium (Ti), titanium nitride (TiN), tantalum (Ta), and tantalum nitride (TaN).

Figure 7:
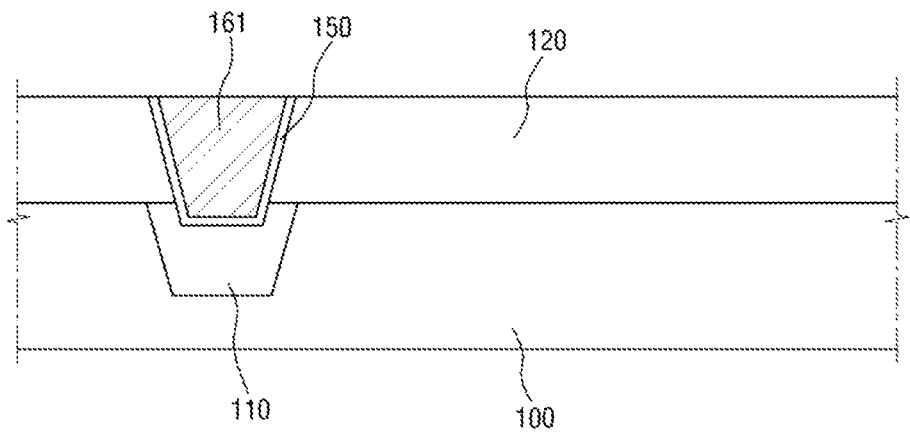

Referring to FIG. 7, the lower plug layer 160 and the first barrier metal layer 150 may be planarized to expose an upper surface of the first interlayer dielectric layer 120 by using a planarization process. The planarization process may be performed using an etch-back process or a chemical mechanical polishing (CMP) process. After the planarization process, a lower plug or capacitor lower electrode 161 may be formed in the lower contact hole 140. The lower plug or capacitor lower electrode 161 may include the first barrier metal layer 150 at the bottom and on the sidewall of the lower contact hole 140 and physically connected to the upper surface of the device isolation region 110.

Figure 8:
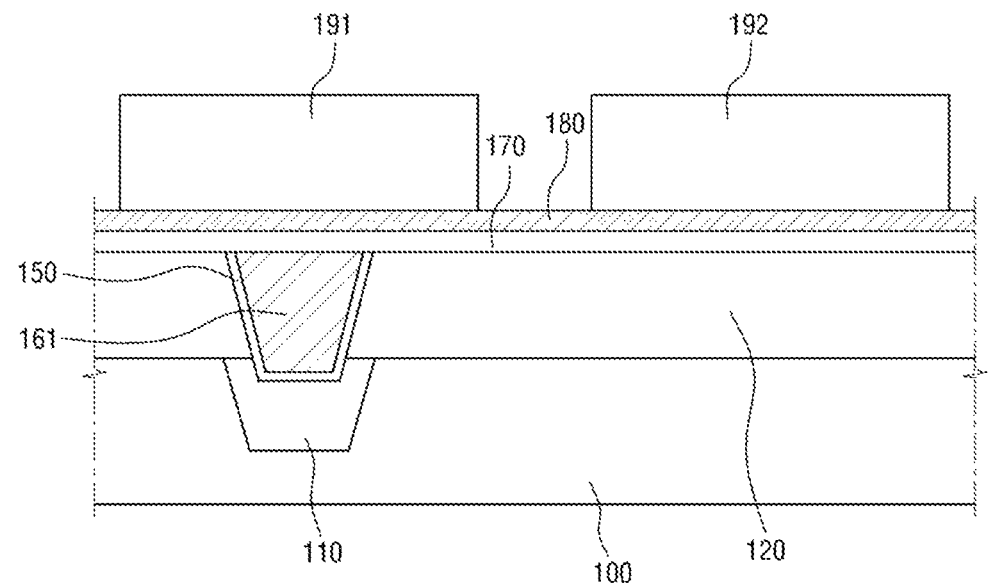

Referring to FIG. 8, a dielectric layer 170 may be formed on the upper surface of the lower plug or capacitor lower electrode 161 and the first interlayer dielectric layer 120. An upper metal electrode layer 180 may be formed on the dielectric layer 170. The dielectric layer 170 may include at least one of a silicon oxide layer and a high-k dielectric layer. The upper metal electrode layer 180 may include at least one of titanium (Ti), titanium nitride (TiN), tantalum (Ta), tantalum nitride (TaN), tungsten silicide ($WSi_x$), tantalum silicon nitride (TaSiN), and tungsten nitride (WN). A second and a third mask pattern 191 and 192 may be formed on the upper metal electrode layer 180. The second and the third mask patterns 191 and 192 may be formed of a photoresist. The second mask pattern 191 may overlap a portion of the lower plug or capacitor lower electrode 161, and the third mask pattern 192 which is spaced apart from the second mask pattern 191 may not overlap any portion of the lower plug or capacitor lower electrode 161.

Figure 9:
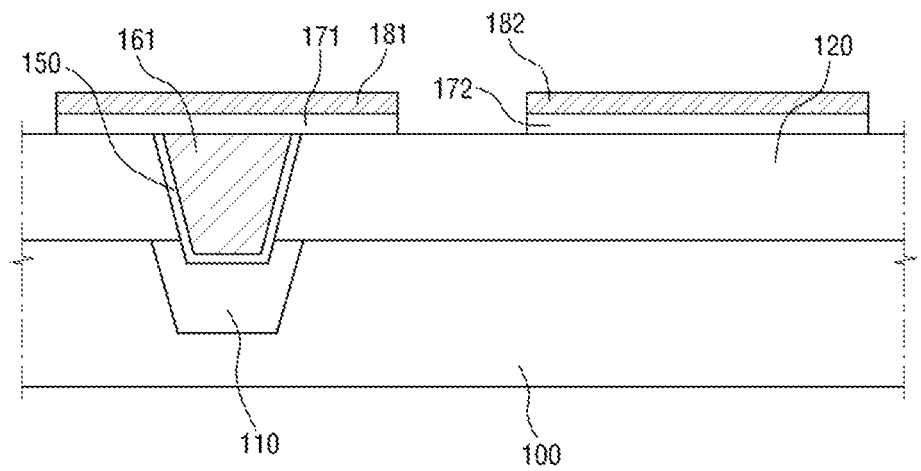

Referring to FIG. 9, a first dielectric layer pattern 171, a second dielectric layer pattern 172, a first metal electrode pattern or capacitor upper electrode 181, and a second metal electrode pattern 182 may be formed by etching the dielectric layer 170 and the upper metal electrode layer 180 using the second and third mask patterns 191 and 192 as etch masks. The second and third mask patterns 191 and 192 may be removed after forming the first and second metal electrode patterns 181 and 182.

Figure 10:
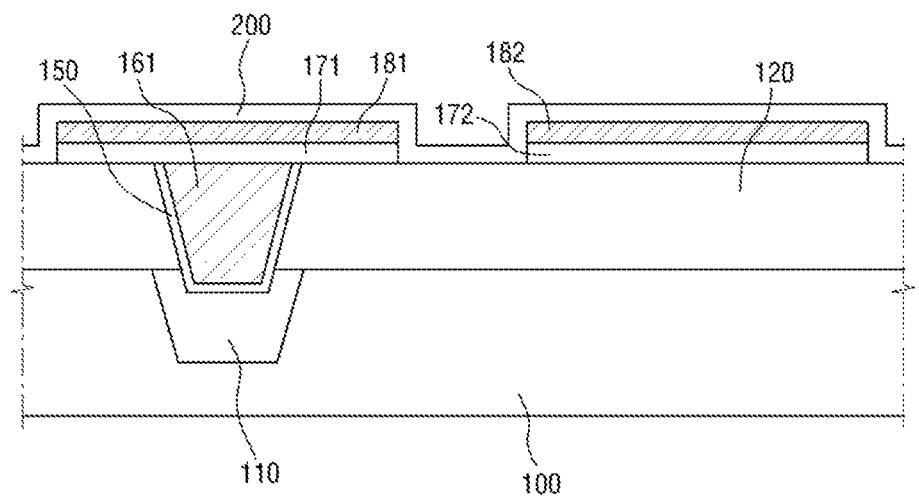

Referring to FIG. 10, an etch stop layer 200 may be formed on the first and second metal electrode patterns 181 and 182.

The etch stop layer 200 may include at least one of a silicon nitride layer and a silicon oxynitride layer.

Figure 11A:
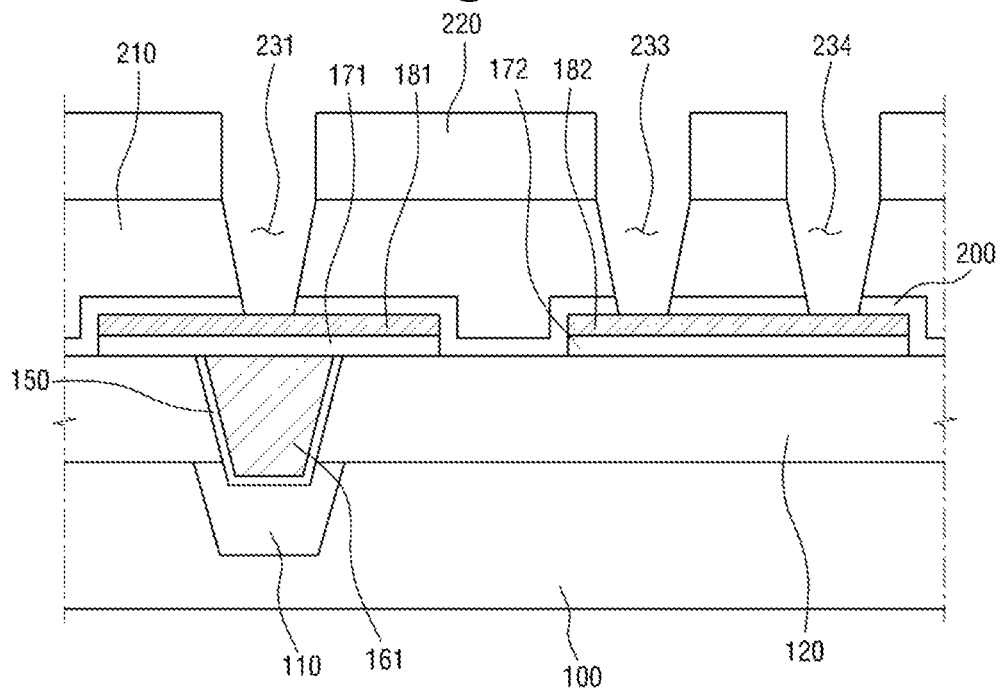

Referring to FIG. 11A, a second interlayer dielectric layer 210 may be formed on the etch stop layer 200. The second interlayer dielectric layer 210 may be formed by using a high-density plasma (HDP) process, a spin-on-glass (SOG) process, a chemical vapor deposition (CVD) process, or a flowable chemical vapor deposition (FCVD) process. The second interlayer dielectric layer 210 may have an upper surface planarized by a chemical mechanical polishing (CMP) process. A fourth mask pattern 220 may be formed on the second interlayer dielectric layer 210. The fourth mask pattern 220 may be formed of a photoresist. First, third and fourth upper contact holes 231, 233 and 234 may be formed by etching the second interlayer dielectric layer 210 and removing the etch stop layer 200 to expose upper surfaces of the first and second metal electrode patterns 181 and 182 using the fourth mask pattern 220 as an etch mask.

Figure 11B:
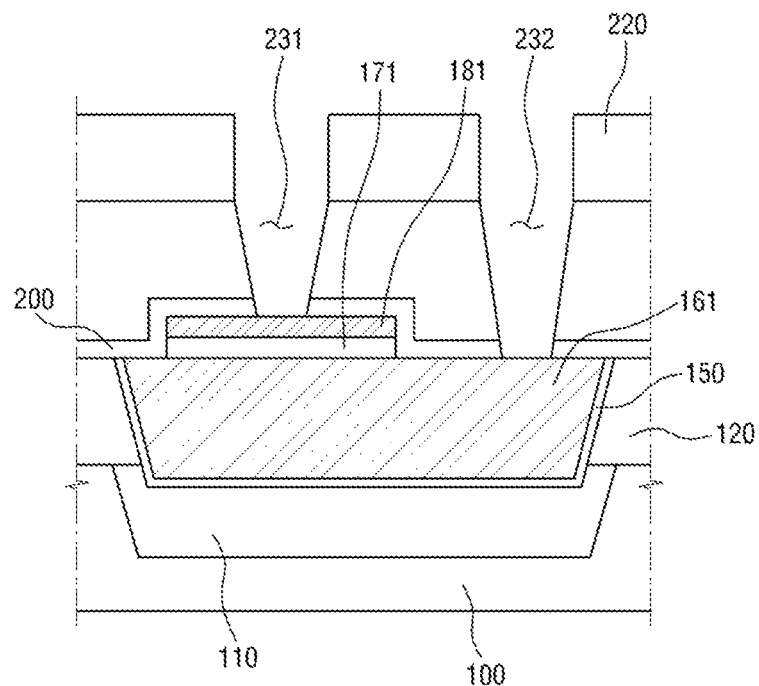

FIG. 11B is a cross-sectional view according to line B-B' of FIG. 1 after forming the etch stop layer 200 as shown in FIG. 10.

Referring to FIG. 11B, a second upper contact hole 232 which is spaced apart from the first upper contact hole 231 may be formed on the lower plug or capacitor lower electrode 161 by etching the second interlayer dielectric layer 210 and removing the etch stop layer 200 to expose the upper surface of the lower plug or capacitor lower electrode 161.

The first, second, third and fourth upper contact holes 231, 232, 233 and 234 may be formed simultaneously and the fourth mask pattern 220 may be removed after forming the first, second, third and fourth upper contact holes 231, 232, 233 and 234.

Figure 12:
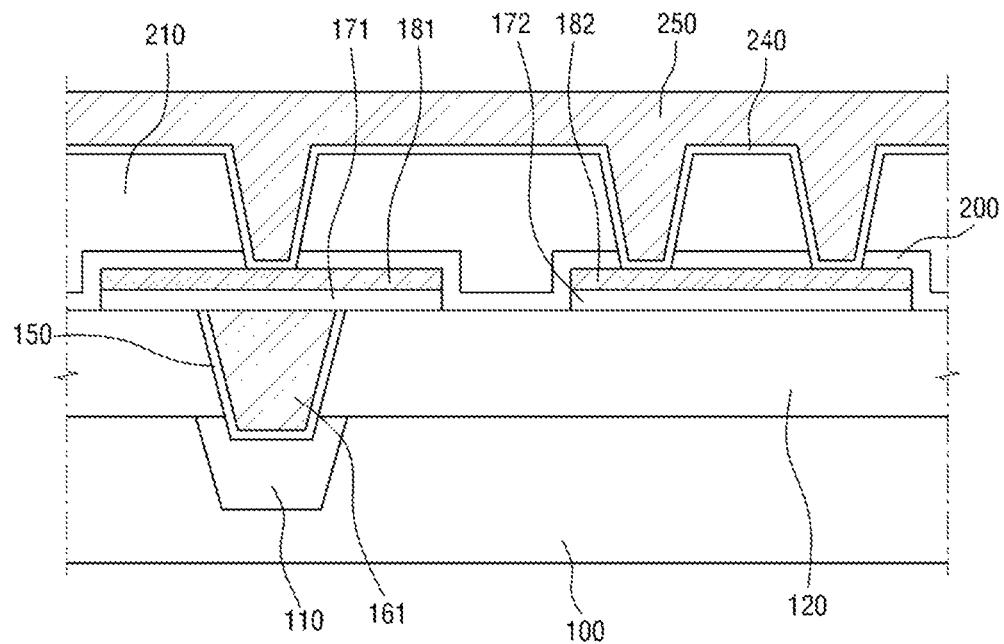

Referring to FIG. 12, an upper plug layer 250 may be formed in the first, second, third and fourth upper contact holes 231, 232, 233 and 234. A second barrier metal layer 240 may be formed at the bottom and on the sidewall of the first, second, third and fourth upper contact holes 231, 232, 233 and 234 before forming the upper plug layer 250. The upper plug layer 250 may include at least one of tungsten (W) and copper (Cu) and the second barrier metal layer 240 may include at least one of cobalt (Co), titanium (Ti), titanium nitride (TiN), tantalum (Ta), and tantalum nitride (TaN).

Figure 13A:
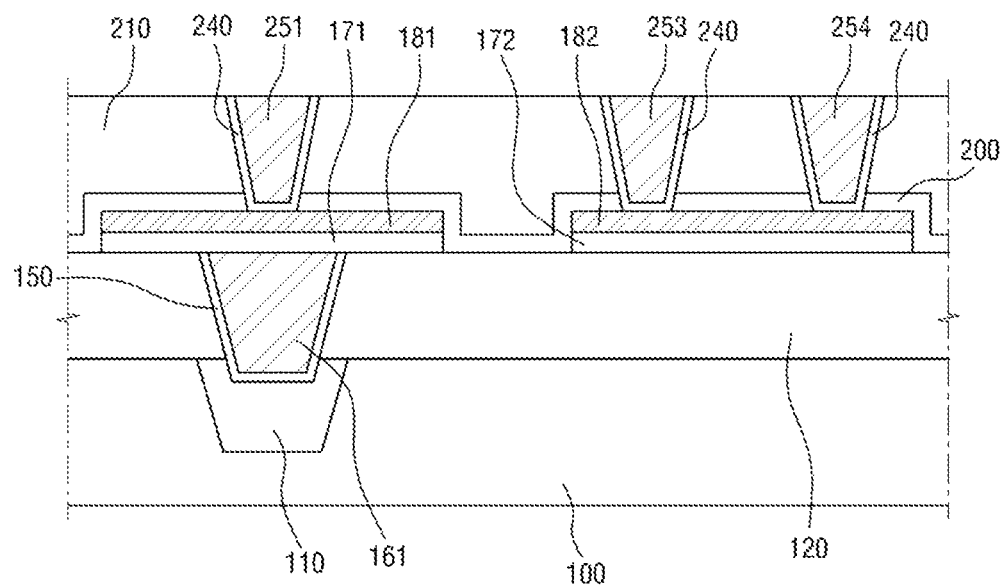

Referring to FIG. 13A, the upper plug layer 250 and the second barrier metal layer 240 may be planarized by using a planarization process to expose the upper surface of the second interlayer dielectric layer 210. The planarization process may include at least one of an etch-back process or a chemical mechanical polishing (CMP) process. The first, third and fourth upper plugs 251, 253, and 254 may be simultaneously formed in the first, third and fourth upper contact holes 231, 233 and 234, respectively. The first, third and fourth upper plugs 251, 253, and 254 may include the second barrier metal layer 240, respectively.

Figure 13B:
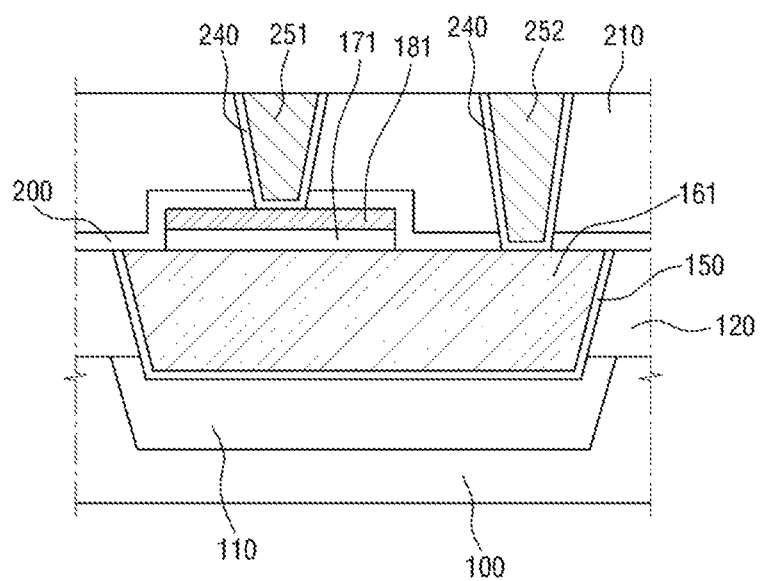

FIG. 13B is a cross-sectional view according to line B-B' of FIG. 1 after performing the planarization process.

Referring to FIG. 13B, a second upper plug 252 may be formed in the second upper contact hole 232. The first, second, third and fourth upper plugs 251, 252, 253 and 254 may be simultaneously formed. The upper surfaces of the first, second, third and fourth upper plugs 251, 252, 253 and 254 may have substantially the same level.

Additional processes for forming a third interlayer dielectric layer, an interconnection, and bit lines, etc., may be performed to form a semiconductor device according to the inventive concepts.

Figure 14:
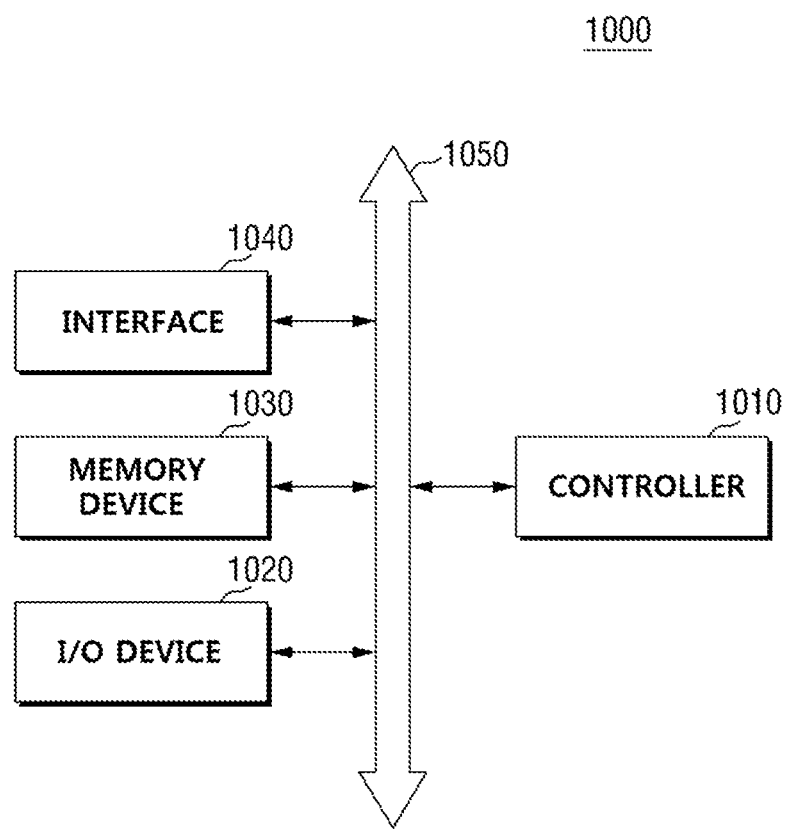
FIG. 14 is a block diagram of a system including a semiconductor device manufactured according to an example embodiment of the inventive concepts.

FIG. 14 is a block diagram of a system 1000 including a semiconductor device manufactured according to an example embodiment of the inventive concepts. The system 1000 may comprise a controller 1010, an input/output device 1020, a memory device 1030, and an interface 1040. The system 1000 may be a portion of a mobile system or a product that can transport information, e.g., a navigation system, a solid state disk, or a household appliance. The mobile system may comprise a PDA, a portable computer, a web tablet, a wireless phone, a mobile phone, a digital music player, or a memory card. The controller 1010 may comprise a microprocessor, a digital signal processor, a microcontroller, or a similar device that can control an executive program. The input/output device 1020 may comprise a keypad, a keyboard, or a display.

The memory device 1030 may not only save codes or data for executing the controller 1010 but also save data executed by the controller 1010. The memory device 1030 may comprise a semiconductor device, which is having a NMOS or PMOS transistor, according to an example embodiment of the inventive concepts, e.g., the memory device 1030 may comprise at least one semiconductor device disclosed in FIGS. 1 through 13B.

The system 1000 may transport data to an external device through an interface 1040. The controller 1010, the input/output device 1020, the memory device 1030, and the interface 1040 may communicate with each other through a bus 1050.

Figure 15:
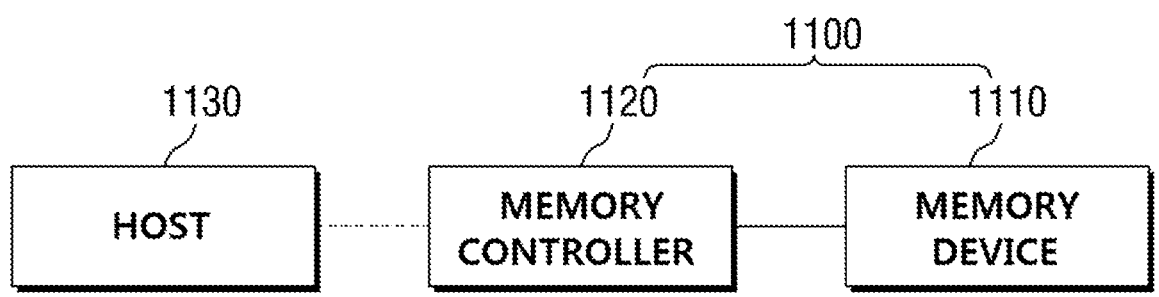
FIG. 15 is a block diagram of a memory card including a semiconductor device manufactured according to an example embodiment of the inventive concepts.

FIG. 15 is another block diagram illustrating a memory card 1100 including a semiconductor device manufactured according to an example embodiment of the inventive concepts. The memory card 1100 may comprise a memory device 1110 and a memory controller 1120. The memory device 1110 may include a DRAM, a FLASH, or a logic device which is manufactured according to an example embodiment of the inventive concepts. The memory controller 1120 may read/save data from/to the memory device 1110 by requesting from a host 1130. The memory controller 1120 may include at least one semiconductor device manufactured as illustrated in FIGS. 1 through 13B.

The above-disclosed subject matter is to be considered illustrative and not restrictive, and the appended claims are intended to cover all such modifications, enhancements, and other embodiments, which fall within the true spirit and scope of the inventive concepts. Thus, the scope of the inventive concepts is to be determined by the broadest permissible interpretation of the following claims and their equivalents, and shall not be restricted or limited by the foregoing detailed description.

What is claimed is:

1. A semiconductor device, comprising:
   an interlayer dielectric layer on a substrate, the interlayer dielectric layer having an upper surface;
   a lower plug extending down into the interlayer dielectric layer from the upper surface of the interlayer dielectric layer, the lower plug having an upper surface;
   a first dielectric layer pattern on the upper surface of the lower plug, at least a portion of the first dielectric layer pattern being directly connected to the upper surface of the lower plug;
   a first metal electrode pattern on the first dielectric layer pattern;
   a first upper plug electrically connected to the first metal electrode pattern; and
   a second upper plug on the lower plug, the second upper plug being spaced apart from the first upper plug.

2. The semiconductor device as claimed in claim 1, further comprising:
   a device isolation region in the substrate,
   wherein the lower plug passes through the interlayer dielectric layer and into the device isolation region.

3. The semiconductor device as claimed in claim 1, wherein the first dielectric layer pattern comprises a high-k dielectric layer.

4. The semiconductor device as claimed in claim 1, wherein the lower plug comprises a capacitor lower electrode and the first metal electrode pattern comprises a capacitor upper electrode.

5. The semiconductor device as claimed in claim 4, wherein the lower plug and the first metal electrode pattern include at least one metal element.

6. The semiconductor device as claimed in claim 5, wherein
   the lower plug includes tungsten (W), and
   the first metal electrode pattern includes at least one of titanium (Ti), titanium nitride (TiN), tantalum (Ta), tantalum nitride (TaN), tungsten silicide ($WSi_x$), tantalum silicon nitride (TaSiN), and tungsten nitride (WN).

7. The semiconductor device as claimed in claim 5, wherein the lower plug comprises a barrier metal layer.

8. The semiconductor device as claimed in claim 1, further comprising:
   a second dielectric layer pattern on the interlayer dielectric layer, the second dielectric layer pattern being spaced apart from the first dielectric layer pattern;
   a second metal electrode pattern on the second dielectric layer pattern;
   a third upper plug on the second metal electrode pattern; and
   a fourth upper plug on the second metal electrode pattern, the fourth upper plug being spaced apart from the third upper plug.

9. The semiconductor device as claimed in claim 8, wherein the upper surfaces of the first upper plug, the second upper plug, the third upper plug and the fourth upper plug are at a same level.

10. The semiconductor device as claimed in claim 8, wherein the second metal electrode pattern comprises a thin film resistor.

11. The semiconductor device as claimed in claim 8, wherein
   the first dielectric layer pattern is at the same level as the second dielectric layer pattern, and
   the first metal electrode pattern is at the same level as the second metal electrode pattern.

12. A semiconductor device, comprising:
   an interlayer dielectric layer on a substrate;
   a capacitor lower electrode in the interlayer dielectric layer, the capacitor lower electrode having a plug shape and a planarized upper surface;
   a first dielectric layer pattern on the planarized upper surface of the capacitor lower electrode;
   a capacitor upper electrode on the first dielectric layer pattern;
   a second dielectric layer pattern on the interlayer dielectric layer, the second dielectric layer pattern being spaced apart from the first dielectric layer pattern and including a same material and having a same thickness as the first dielectric layer pattern; and
   a thin film resistor on the second dielectric layer pattern, the thin film resistor including a same material and having a same thickness as the capacitor upper electrode.

13. The semiconductor device as claimed in claim 12, further comprising:

a device isolation region in the substrate,
wherein the capacitor lower electrode passes through the interlayer dielectric layer to connect with the device isolation region.

14. The semiconductor device as claimed in claim 12, further comprising:
an etch stop layer conformally formed on the interlayer dielectric layer, the upper surface of the capacitor upper electrode, and the upper surface of the thin film resistor.

15. A semiconductor device, comprising:
an interlayer dielectric layer;
first and second dielectric layer patterns spaced apart from each other on the interlayer dielectric layer;
a lower plug disposed in the interlayer dielectric layer and directly connected to a bottom surface of the first dielectric layer pattern;
first and second upper plugs spaced apart from each other on the lower plug;
first and second metal electrode patterns on the first and second dielectric layer patterns, respectively, the first metal electrode pattern connected to a bottom surface of the first upper plug; and
third and fourth upper plugs spaced apart from each other on the second metal electrode pattern.

16. The semiconductor device as claimed in claim 15, wherein the upper surfaces of the first upper plug, the second upper plug, the third upper plug and the fourth upper plug are at a same level.

17. The semiconductor device as claimed in claim 15, wherein
the first dielectric layer pattern is at the same level as the second dielectric layer pattern, and
the first metal electrode pattern is at the same level as the second metal electrode pattern.

18. The semiconductor device as claimed in claim 15, wherein
the lower plug comprises a capacitor lower electrode,
the first metal electrode pattern comprises a capacitor upper electrode, and
the second metal electrode pattern comprises a thin film resistor.

* * * * *